United States Patent
Blauvelt et al.

(10) Patent No.: US 9,059,801 B1
(45) Date of Patent: Jun. 16, 2015

(54) OPTICAL MODULATOR

(71) Applicant: EMCORE Corporation, Alhambra, CA (US)

(72) Inventors: Henry A. Blauvelt, San Marino, CA (US); Xiaoguang He, Diamond Bar, CA (US); Kerry Vahala, Pasadena, CA (US)

(73) Assignee: Emcore Corporation, Alhambra, CA (US)

( * ) Notice: Subject to any disclaimer, the term of this patent is extended or adjusted under 35 U.S.C. 154(b) by 131 days.

(21) Appl. No.: 13/831,334

(22) Filed: Mar. 14, 2013

(51) Int. Cl.
*H01S 5/00* (2006.01)
*H04B 10/2575* (2013.01)
*H01S 5/026* (2006.01)
*H01S 5/10* (2006.01)

(52) U.S. Cl.
CPC .......... *H04B 10/2575* (2013.01); *H01S 5/0265* (2013.01); *H01S 5/026* (2013.01); *H01S 5/1092* (2013.01)

(58) Field of Classification Search
CPC ...... H01S 5/0265; H01S 5/026; H01S 5/1092
USPC ................. 372/50.1, 50.121, 50.122
See application file for complete search history.

(56) References Cited

U.S. PATENT DOCUMENTS

| | | | |
|---|---|---|---|
| 5,170,402 A | 12/1992 | Ogita et al. | |
| 5,699,179 A * | 12/1997 | Gopalakrishnan | 398/194 |
| 6,167,172 A | 12/2000 | Kunkee et al. | |
| 2004/0218931 A1* | 11/2004 | Frederiksen et al. | 398/198 |
| 2005/0013332 A1* | 1/2005 | Kish et al. | 372/32 |
| 2005/0018732 A1* | 1/2005 | Bond et al. | 372/50 |
| 2007/0134002 A1* | 6/2007 | Arahira | 398/155 |
| 2011/0091146 A1 | 4/2011 | Knights et al. | |
| 2012/0002694 A1* | 1/2012 | Bowers et al. | 372/45.01 |
| 2012/0128375 A1 | 5/2012 | Kimoto et al. | |
| 2013/0021891 A1 | 1/2013 | Fujita et al. | |

FOREIGN PATENT DOCUMENTS

| | | |
|---|---|---|
| EP | 0 556 974 A2 | 8/1993 |
| WO | 02/058251 A2 | 7/2002 |

OTHER PUBLICATIONS

B. Thedrez et al., "Power and facet phase dependence of chirp for index and gain-coupled DFB lasers," IEEE, pp. 175-176 (1998).
M. Jabbari et al., "XPM Response of Multiple Quantum Well Chirped DFB-SOA All Optical Flip-Flop Switching," World Academy of Science, Engineering and technology, 56 pp. 696-700 (2009).
D. Maywar et al., "Effect of Chirped Gratings on Reflective Optical Bistability in DFB Semiconductor Laser Amplifiers," IEEE J. Quantum Electronics, 34, No. 2, pp. 2364-2370 (Dec. 1998).
P. Brosson, *Semiconductor lasers and integrated devices*, EDP Sciences, pp. 1-53 (2002).
European Patent Office, search report in Application No. 14020022.1 (dated Feb. 18, 2015).

* cited by examiner

*Primary Examiner* — Kinam Park

(57) ABSTRACT

An optical modulator including an information-containing radio frequency signal input; a semiconductor device having an optical input optically for receiving the coherent light beam, and a electrode connected to said radio frequency signal input and having a modulated bias potential so that current is generated in the second semiconductor device and extracted therefrom, while the coherent light beam is optically modulated by the signal changing the carrier density in the semiconductor device.

24 Claims, 4 Drawing Sheets

OPTICAL MODULATOR

BACKGROUND OF THE INVENTION

1. Field of the Invention

This invention relates to an optical transmission systems for analog or digital radio-frequency (RF) signals using an externally modulated solid-state laser, and in particular to an optical modulator coupled to such laser.

2. Description of the Related Art

An optical telecommunication system transmits information from one place to another by way of an optical carrier whose frequency typically is in the visible or near-infrared region of the electromagnetic spectrum. A carrier with such a high frequency is sometimes referred to as an optical signal, an optical carrier, light beam, or a lightwave signal. The optical telecommunication system includes several optical fibers and each optical fiber includes multiple channels. A channel is a specified frequency band of an electromagnetic signal, and is sometimes referred to as a wavelength. The purpose for using multiple channels in the same optical fiber (called dense wavelength division multiplexing (DWDM)) is to take advantage of the high capacity (i.e., bandwidth) offered by optical fibers. Essentially, each channel has its own wavelength, and all wavelengths are separated enough to prevent overlap. International Telecommunications Union (ITU) standards currently determines the channel separations.

One link of an optical telecommunication system typically has a transmitter, the optical fiber, and a receiver. The optical transmitter has a laser, which converts an electrical signal into the optical signal and launches it into the optical fiber. The optical fiber transports the optical signal to the receiver. The receiver converts the optical signal back into an electrical signal.

Optical transmitters for the transmission of analog or digital radio-frequency (RF) signals over an optical fiber may use either a directly modulated laser or a continuous wave (CW) laser coupled to an external modulator.

Directly modulating the analog intensity of a light-emitting diode (LED) or semiconductor laser with an electrical signal is considered among the simplest methods known in the art for transmitting analog signals, such as voice and video signals, over optical fibers. Although such analog transmission techniques have the advantage of substantially smaller bandwidth requirements than digital transmission, such as digital pulse code modulation, or analog or pulse frequency modulation, the use of amplitude modulation typically places more stringent requirements on the noise and distortion characteristics of the transmitter. A limiting factor in such links can be the second order distortion due to the combination of optical frequency modulation, or chirp, and fiber dispersion.

For these reasons, direct modulation techniques have typically been used in connection with 1310 nm lasers where the application is to short transmission links that employ fiber optic links with low dispersion. It is also possible to use direct modulation of 1550 nm lasers, but in this case the distortion produced by chirp and dispersion must be cancelled using a predistorter that is set for the specific fiber length. In some case, such as when the signal must be sent to more than one location or through redundant fiber links of different length, such a programmable predistorter can be undesirable.

To avoid the distortion problems related to chirp and dispersion at 1550 nm with direct modulation, low chirp external optical modulators are commonly used in analog fiber optic communication systems, such as CATV signal distribution, to amplitude modulate an optical carrier with an information or content-containing signal, such as audio, video, or data signals.

There are two general types of external optical modulators implemented as semiconductor devices known in the prior art: Mach Zehnder modulators and electro-absorption modulators. A Mach-Zehnder modulator splits the optical beam into two arms or paths on the semiconductor device, one arm of which incorporates a phase modulator. The beams are then recombined which results in interference of the two wavefronts, thereby amplitude modulating the resulting light beam as a function of the modulated bias signal applied to the phase modulated arm. An electro-absorption modulator is implemented as a waveguide in a semiconductor device in which the absorption spectrum in the waveguide is modulated by an applied electric bias field, which changes the band gap energy in that region of the semiconductor, thereby modulating the amplitude or intensity of the light beam traversing the waveguide.

SUMMARY OF THE INVENTION

Objects of the Disclosure

It is an object of the present invention to provide an improved optical transmission system using an externally modulated laser.

It is another object of the present invention to provide an electro-optical modulator for use in an externally modulated 1550 nm optical transmission system with high power and good linearity using a modulated semiconductor saturable absorber.

It is still another object of the present invention to provide a highly linear optical transmission system suitable for long haul dispersive optical fiber media using an externally modulated laser with a predetermined bias, and an optical modulator with a lower electrical bias.

It is still another object of the present invention to provide an optical modulator having a waveguide region operated in a positive voltage, negative current characteristic region suitable for use in an analog optical transmission system using long haul dispersive optical fiber media.

It is also an object of the present invention to provide a method for biasing a semiconductor waveguide region in an electro-optical modulator in a broadband analog optical transmission system so that carriers are excited into a conduction band and are extracted from the semiconductor by a electrical field.

Some implementations or embodiments may achieve fewer than all of the foregoing objects.

Features of the Invention

Briefly, and in general terms, the present invention provides an optical transmitter for generating a modulated optical signal for transmission over a fiber optic link to a remote receiver, including a laser; a modulator coupled to the laser for externally modulating the laser with a RF signal to produce an optical signal by changing the saturation power of a semiconductor saturable absorber.

In another aspect, the present invention provides a method of operating an optical modulator including a semiconductor device having an optical input for receiving a continuous wave coherent light beam having a predetermined power, a waveguide layer for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, comprising applying a continuous wave coherent light beam to the optical input; and applying a bias voltage to the electrode so that the coherent light beam is optically modulated by the signal modulating the absorption characteristic in the semiconductor device while the current generated in the semiconductor device as a result of photoabsorption of the continuous wave coherent light beam is extracted from the semiconductor device by the bias field.

In another aspect, the present invention provides an optical modulator comprising an information-containing radio frequency signal input; a semiconductor device having an optical input optically for receiving the coherent light beam, and a electrode connected to said radio frequency signal input and having a modulated bias potential so that current is generated in the second semiconductor device and extracted therefrom, while the coherent light beam is optically modulated by the signal changing the carrier density in the semiconductor device; and an optical output for transferring the modulated optical signal.

In another aspect, the present invention provides an electro-optical arrangement comprising a semiconductor device including a first semiconductor region including a laser resonator operable to produce a coherent light output in response to current injection; and a second semiconductor region disposed adjacent to the first semiconductor region and separated therefrom by a channel, the second semiconductor region having an optical input optically coupled thereto for receiving the coherent light output from the first semiconductor region, the second semiconductor device being electrically biased at a lower second bias potential than the first semiconductor device and electrically coupled to an radio frequency information-containing signal source, so that current is generated in the second semiconductor device and extracted therefrom, while the coherent light beam is optically modulated by the signal changing the carrier density in the semiconductor device; and having an optical output for transferring the modulated optical signal.

In another aspect, the present invention provides a laser transmitter for optical communications comprising a first semiconductor device including a laser resonator operable to produce a coherent light output in response to current injection at a first bias potential; a second semiconductor device disposed adjacent to the first semiconductor device and having an optical input optically coupled thereto for receiving the coherent light output, the second semiconductor device being electrically biased at a lower second bias potential than the first semiconductor device and electrically coupled to an radio frequency information-containing signal source, so that current is generated in the second semiconductor device and extracted therefrom, while the coherent light beam is optically modulated by the signal changing the carrier density in the semiconductor device; and having an optical output for transferring the modulated optical signal.

In another aspect, the present invention provides a method of operating an optical modulator including a semiconductor device having an optical input for receiving a continuous wave coherent light beam having a predetermined power, a waveguide layer for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, comprising: applying a continuous wave coherent light beam to the optical input; and applying a positive bias voltage to the electrode so that the coherent light beam is optically modulated by the signal modulating the absorption characteristic in the semiconductor device by operating in the negative current region of the I-V characteristic so that the current generated in the semiconductor device as a result of photoabsorption of the continuous wave coherent light beam is extracted from the semiconductor device by the bias field.

In some embodiments, the laser and the modulator are integrated on a single semiconductor substrate.

In another aspect, the bias potential applied to the laser is less than the bias potential applied to the modulator.

In another aspect, in operation the modulator generates electrical current from the photovoltaic effect, which is withdrawn from the modulator.

In another aspect, the carrier density along the length of the semiconductor modulator in the direction of the optical beam is modulated, thereby optically modulating the cw optical beam entering the modulator.

In another aspect, the modulator comprises an InP semiconductor waveguide structure.

In another aspect, the laser comprises an InP semiconductor gain structure having a mirrored first end region and a second end region disposed adjacent to the modulator.

In another aspect, the laser comprises a first electrode disposed over the InP semiconductor gain structure.

In another aspect, the modulator comprises second electrode disposed over the InP semiconductor waveguide structure.

In another aspect, the laser and the modulator are integrated on a single semiconductor substrate, and a vertical gap extending approximately 1 micron into the substrate electrically separates the laser and the modulator. The laser and modulator are optically connected by a common optical waveguide.

Additional objects, advantages, and novel features of the present invention will become apparent to those skilled in the art form this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

BRIEF DESCRIPTION OF THE DRAWINGS

These and other features and advantages of this invention will be better understood and more fully appreciated by reference to the following detailed description when considered in conjunction with the accompanying drawings, wherein.

Figure 1:
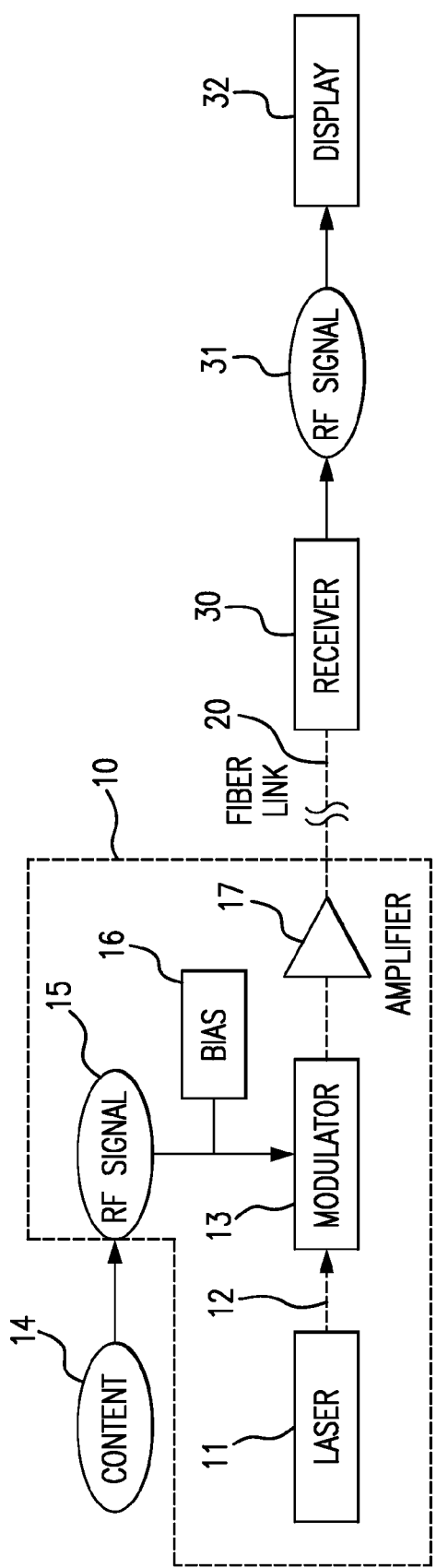
FIG. 1 is an example of an externally modulated optical transmission system known in the prior art.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein and with respect to which the invention could be of utility.

DETAILED DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is block diagram of a prior art optical transmission system in which information or "content" such as audio, video, data files, data bases, or other data is transmitted by an optical transmitter over an optical fiber link to a remote receiver, where the information content is reproduced, displayed, performed, executed or is otherwise utilized. The optical transmitter may be such as represented in U.S. Pat. No. 5,699,179 utilizing an external modulator. The transmitter, shown generally at 10, transmits an optical signal to a remote receiver 30 over an optical fiber path 20. The transmitter 10 includes a semiconductor laser 11, which produces a continuous wave (CW) output. Typical examples of such lasers are distributed feedback (DFB) lasers or Fabry-Perot lasers that produce an output optical beam at a wavelength of 1,550 nm. The un-modulated optical signal from the laser is coupled to a modulator 13 by optical fiber 12. The modulator 13 may be a single modulator such as a Mach-Zehnder modulator, a cascaded MZ modulator or more than one modulator such as in a feed-forward linearizer.

The information or content-containing signal 14, such as audio, video, or data, is initially converted into a broadband RF signal in a suitable channel or frequency band for transmission, such as an amplitude modulated vestigial sideband (AM-SDB) cable television (CATV) or video signal, or a digital signal such as a quadrature amplitude modulated (QAM) symbols which represents the data in digital format. The broadband RF signal 15 is applied to the modulator 13 via a terminal or electrode on its surface. An electrical bias 16 is also applied to the modulator 13.

The modulated optical signal which carries the video data is coupled to an amplifier 17, which in turn is coupled to the by a fiber link 20. The amplifier 17 is typically an erbium doped fiber amplifier (EDFA). The amplified optical signal is transmitted over the fiber optical transmission link 20 to the receiver 30. The optical fiber transmission link 20 may be a long-distance link extending up to 100 km. In this case, line amplifiers such as EDFA 17 may be provided at spaced intervals along in the line in order to boost the signal to desired levels. At the receiver 30, an amplifier (not shown) may also be provided to boost the incoming optical signal. The boosted signal is then applied to a photodetector and demodulated at the receiver 30 to an RF electrical signal 31, which is applied to a terminal or display 32 where the original audio, video or data signal is reproduced at the remote location.

Figure 2:
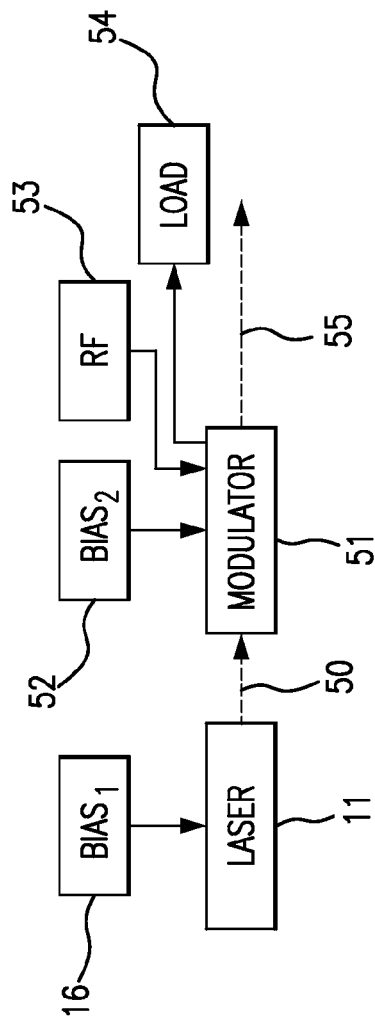
FIG. 2 is a first embodiment of a external modulator coupled to a laser according to the present disclosure.

FIG. 2 is a first embodiment of an optical transmitter including an external modulator coupled to a laser according to the present disclosure. There is depicted a semiconductor laser 11, which produces a continuous wave (CW) output. The laser 11 is operated at an electrical bias which is denoted as Bias (1). The un-modulated optical beam from the laser is coupled to an external modulator 51 by optical fiber 50, or free space propagation. The modulator 51 is configured as a waveguide with electrodes coupled thereto, and operated at an electrical bias which is denoted as Bias (2), which is less than that Bias (1). In some embodiments, Bias (2) may be 0.8 volts, and Bias (1) may be 1.2 volts.

The information-containing RF signal 53 is also applied to the electrode of the modulator 51, so that during modulation the electrical bias applied to the modulator remains less than Bias (1). The electrical bias applied to the modulator 51 determines the amount of the cw light beam from the laser 11 that is absorbed by the modulator 51. In this way, the cw light beam entering the modulator is modified or modulated by the RF signal 53. An optical output is provided for transferring the modulated optical beam to an output fiber 55.

Figure 3:
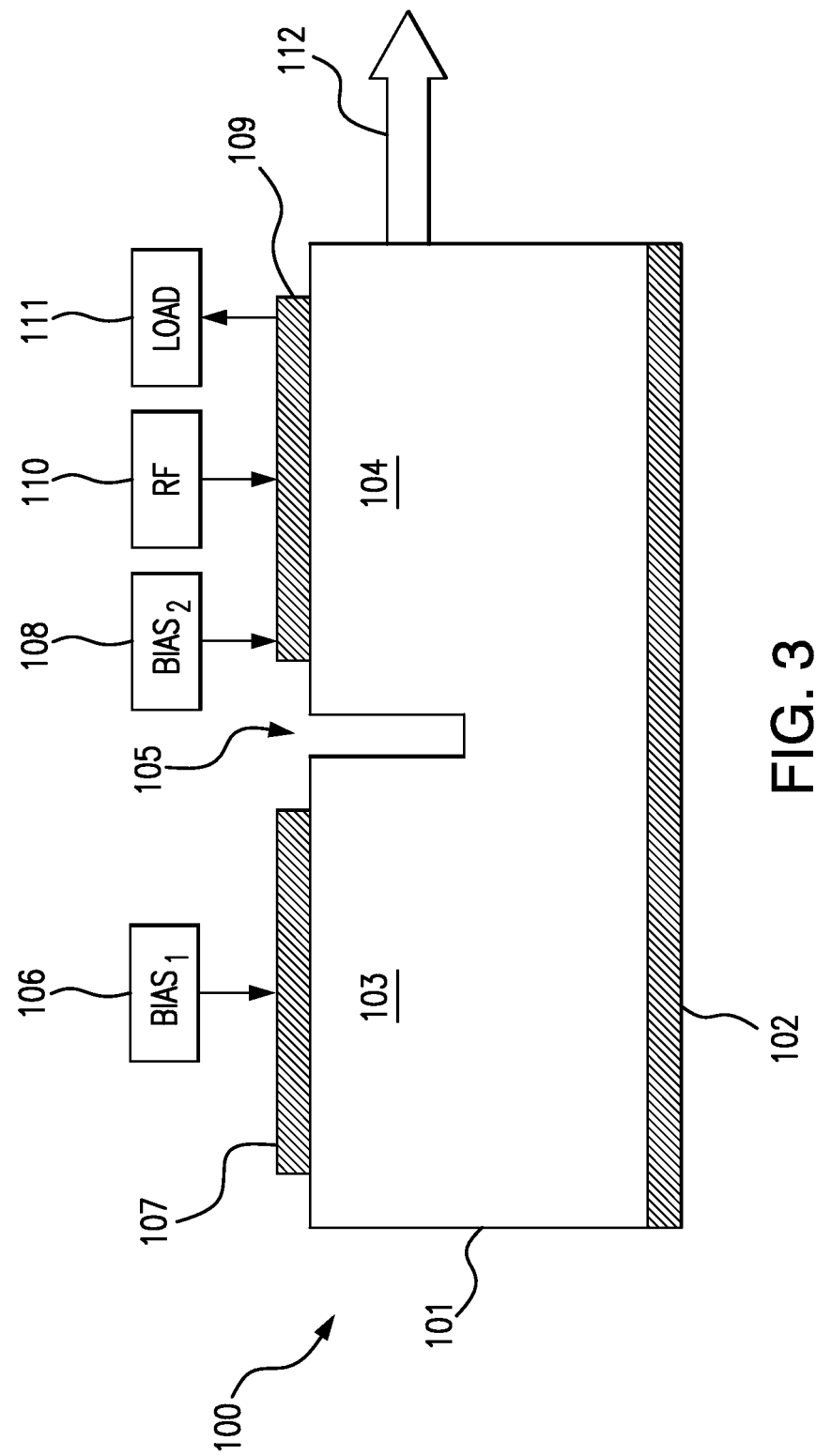
FIG. 3 is a second embodiment of a external modulator coupled to a laser according to the present disclosure.

FIG. 3 is a second embodiment of an external modulator coupled to a laser according to the present disclosure. The design and operation of the device of FIG. 3 is similar to that of FIG. 2, except that the laser and the modulator are implemented on a single integral semiconductor device. More particularly, there is depicted a semiconductor device 100 including a first semiconductor region 103 including a laser resonator 100 operable to produce a coherent light output in response to current injection; and a second semiconductor region 104 disposed adjacent to the first semiconductor region and separated therefrom by a channel 105. The second semiconductor region 104 has an optical input optically coupled thereto for receiving the coherent light output emitted from the first semiconductor region 103 and traversing the channel 105.

The first semiconductor device 103 is electrically biased by an electrode 107 on the top surface, which is connected to an external electrical bias potential 106 to inject current into the region 103. The second semiconductor device includes a waveguide layer for transferring the light beam from the optical input, an electrode 109 connected to a radio frequency signal input 110 and a bias potential 108 for creating an electric field in the waveguide and optically modulating the light beam as the beam traverses the waveguide. The second semiconductor device further includes an optical output 112 connected to the waveguide for transferring the modulated optical signal to an external fiber or other optical component. The bias voltage applied to the electrode 109 is appropriately selected so that the coherent light beam in the waveguide is optically modulated by the applied RF signal by modifying or modulating the absorption characteristic in the semiconductor device while the current generated in the waveguide as a result of photoabsorption of the continuous wave coherent light beam is extracted from the semiconductor device. The RF and DC currents generated are sunk by the RF source and DC bias respectively.

In some embodiments, the laser and the modulator comprise a single chip InP semiconductor device. The laser may comprise an InP semiconductor gain structure region 103 having a mirrored first end region and a second end region disposed adjacent to the modulator. The first electrode 107 is disposed over the InP semiconductor gain structure 103, and the second electrode 109 is disposed over the InP semiconductor waveguide structure 104, and a ground electrode 102 is provided extending over the bottom surface of the entire semiconductor structure.

In the embodiment in which the laser and the modulator are integrated on a single semiconductor substrate, and a vertical gap extending about 1 micron into the substrate electrically separates the laser and the modulator, or the first and second semiconductor regions 103 and 104.

In other embodiments, the laser and the modulator are implemented on two adjacent discrete semiconductor devices, such as depicted in FIG. 2. In some embodiments, an air gap having a width of less than 1 micron may separate the laser and the modulator devices.

The first semiconductor device 103 is electrically biased by an electrode 107 on the top surface, which is connected to an external electrical bias potential 106. The second semiconductor device 104 is electrically biased at a lower second bias potential than the first semiconductor device 103. The specific biasing of the second semiconductor device 104 and the operating current versus voltage characteristics of the device will be described in greater detail with reference to FIG. 4.

Figure 4:
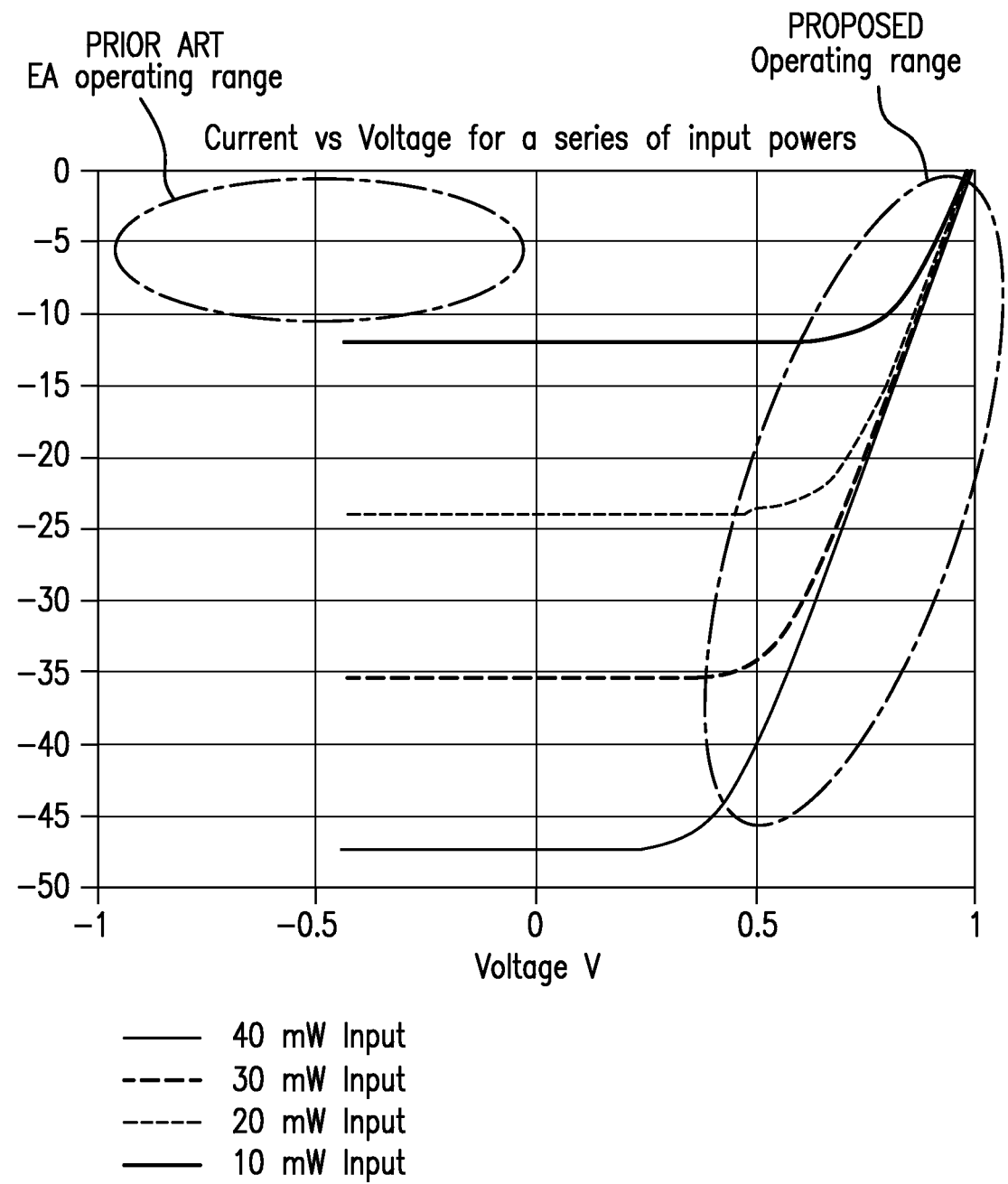
FIG. 4 is a graph of the current versus voltage operating characteristics of an electro-optical modulator for various input powers in the prior art and according to the present disclosure.

FIG. 4 is a graph of the current versus voltage operating characteristics of an electro-optical modulator for various input powers (i.e., 10 mW, 20 mW, 30 mW, and 40 mW) of the cw optical beam in the prior art and according to the present disclosure. In the prior art, in an electro-absorption modulator, the waveguide is biased to operate in a negative voltage, positive current region as shown by the dashed line region marked "PRIOR ART EA OPERATING RANGE". In the modulator according to the present disclosure, the waveguide is biased to operate in a positive voltage, higher negative current region as shown by the dashed line region marked "PROPOSED OPERATING RANGE".

In the absence of any applied bias signal, a small amount of the cw optical beam is absorbed in the modulator and this causes a steady-state carrier density to build up in the modulator. These carriers recombine with a typical lifetime of about 1 nanosecond. An equilibrium level is reached when the number of carriers generated by optical absorption balances the number lost through recombination. In an embodiment, the absorption is high when the carrier level is low and the absorption is low and when the carrier density is high. When the bias signal is applied, carriers are extracted from the modulator. This lowers the carrier density, and therefore increases absorption of the modulator. In particular, if a current of −10 mA is extracted from the modulator, then the absorption is increased by an amount required to produce that current of −10 mA. Similarly, if a current of −20 mA is extracted from the modulator, then the absorption is increased by an amount required to produce that current of −20 mA. Another way of describing the operation is that carriers in the semiconductor waveguide generated by the cw optical beam are excited into a conduction band and are extracted from the semiconductor region by an applied electrical bias field.

Figure 5:
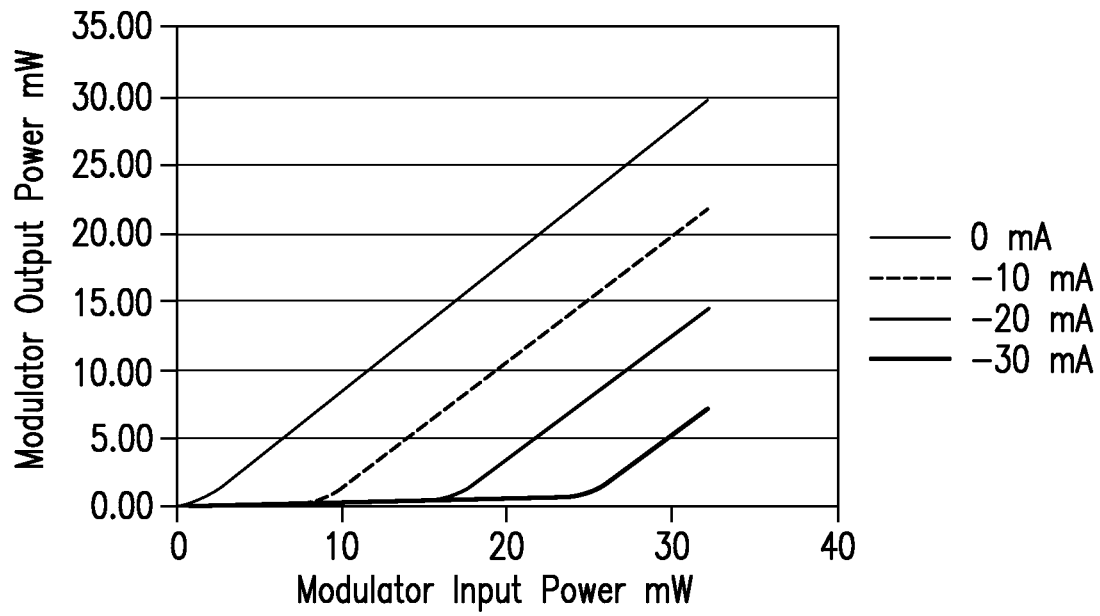
FIG. 5 is a graph depicting the modulator output power versus the modulator input power at various current operation levels according to the present disclosure.

FIG. 5 shows a graph of the output power vs input power for the modulator according to the present disclosure with the parameter being the current extracted from the modulator. Since the proposed modulator has a low RF impedance, it is possible to modulate it in a manner that is close to a current source modulation (at least down to the point that the output power is close to 0). As can be seen from the FIG. 5, this really modulates the saturation power of the device. When operated at a fixed input power of say 30 mW, the net effect is a modulation of the optical output power. The operation is analogous to an optical power subtraction device in which an amount of light corresponding to the extracted current is absorbed from the input cw optical beam. In effect, after the amount of light corresponding to the extracted current is absorbed, that absorption mechanism is saturated.

Figure 6:
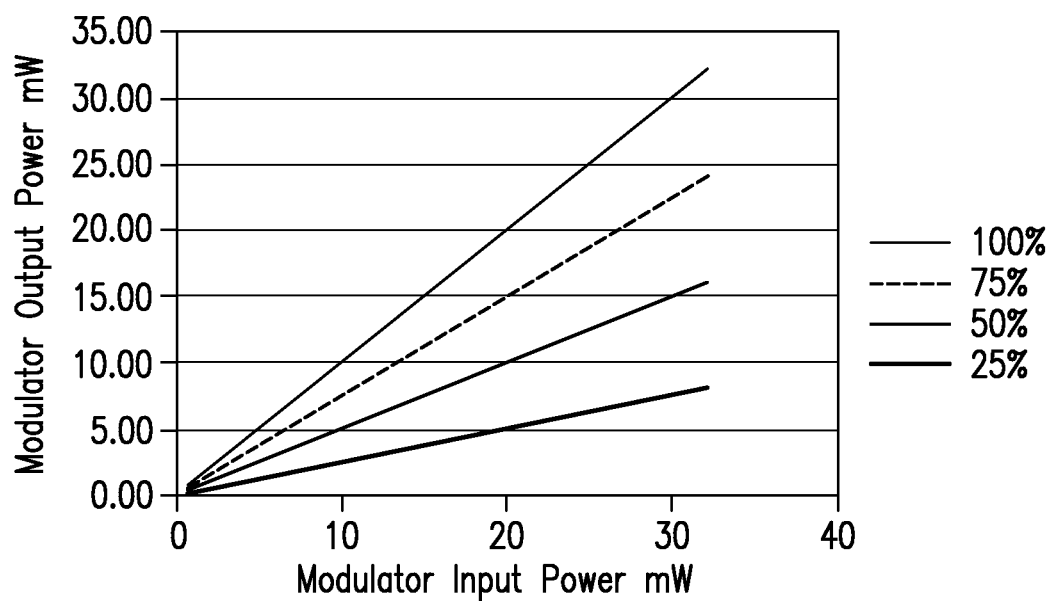
FIG. 6 is a graph depicting the modulator output power versus the modulator input power at various operation levels according to a Mach Zender or EA modulator known in the prior art.

The operation of the modulator of FIG. 5 should be contrasted with a traditional modulator where the optical transmission factor is modulated. FIG. 6 shows what happens with a MZ or EA type modulator. The parameter in this FIG. 6 is the transmission through the modulator. For a fixed input power of 30 mW, a modulated output similar to the output of the proposed modulator is produced. However, variation of the output optical power with input optical power with a fixed bias signal is substantially linear, in contrast to the saturation-type variation of the proposed modulator. This reflects the fundamentally different modulation mechanism involved in the proposed modulator.

Although some specific embodiments of the present invention have been demonstrated in detail with examples, it should be understood by a person skilled in the art that the above examples are only intended to be illustrative but not to limit the scope of the present invention. It should be understood that the above embodiments can be modified without departing from the scope and spirit of the present invention which are to be defined by the attached claims.

The invention claimed is:

1. An optical modulator comprising:
an information-containing radio frequency signal input;
a semiconductor device having an optical input for receiving a continuous wave coherent light beam, and an electrode connected to said radio frequency signal input and having a modulated positive bias potential so that current is generated in the semiconductor device and extracted therefrom, while the coherent light beam is optically modulated by the signal changing the carrier density in the semiconductor device; and
an optical output for transferring the modulated optical signal.

2. The optical modulator as defined in claim 1, further comprising a laser for generating the coherent-light beam, wherein the laser and the modulator are integrated on a single semiconductor substrate.

3. The optical modulator as defined in claim 2, wherein the bias potential applied to the laser is more than the bias potential applied to the modulator.

4. The optical modulator as defined in claim 1, wherein the electrode connected to the modulator is coupled to a load or current sink.

5. The optical modulator as defined in claim 1, wherein the modulator generates electrical current from the photovoltaic effect, the current being withdrawn or extracted from the modulator.

6. The optical modulator as defined in claim 1, wherein the carrier density along the length of the semiconductor modulator in the direction of the optical beam is modulated, thereby optically modulating the cw optical beam entering the modulator.

7. The optical modulator as defined in claim 1, the semiconductor device comprises an InP semiconductor waveguide structure.

8. The optical modulator as defined in claim 2, wherein the laser comprises an InP semiconductor gam structure having a mirrored first end region and a second end region disposed adjacent to the modulator.

9. The optical modulator as defined in claim 8, wherein the laser comprises a first electrode disposed over the InP semiconductor gain structure.

10. The optical modulator as defined in claim 9, wherein the modulator comprises second electrode disposed over the InP semiconductor waveguide structure.

11. An electro-optical arrangement comprising:
a semiconductor device including:
(a) a first semiconductor region including a laser resonator operable to produce a coherent light output in response to current injection at a first bias potential; and
(b) a second semiconductor region disposed adjacent to the first semiconductor region and separated therefrom by a channel, the second semiconductor region having an optical input optically coupled thereto for receiving the coherent light output from the first semiconductor region, the second semiconductor device being electrically biased at a second positive bias potential lower than the first bias potential applied to the first semiconductor region, the second semiconductor region being electrically coupled to a radio frequency information-containing signal source, so that current is generated in the second semiconductor region and extracted therefrom, while the coherent light beam is optically modulated by the signal changing the carrier density in the semiconductor device; and having an optical output for transferring the modulated optical signal.

12. The electro-optical arrangement as defined in claim 11, the semiconductor device comprises an InP semiconductor waveguide structure.

13. The electro-optical arrangement as defined in claim 12, wherein the laser comprises an InP semiconductor gain structure having a mirrored first end region and a second end region disposed adjacent to the modulator.

14. The electro-optical arrangement as defined in claim 13, wherein the laser comprises a first electrode disposed over the InP semiconductor gain structure.

15. The electro-optical arrangement as defined in claim 14, wherein the modulator comprises a second electrode disposed over the InP semiconductor waveguide structure.

16. A laser transmitter for optical communications comprising:
a first semiconductor device including a laser resonator operable to produce a coherent light output in response to current injection at a first bias potential;
a second semiconductor device disposed adjacent to the first semiconductor device and having an optical input optically coupled thereto for receiving the coherent light output, the second semiconductor device being electrically biased at a second positive bias potential lower than the first bias potential applied to the first semiconductor device, the second semiconductor device being electrically coupled to a radio frequency information-containing signal source, so that current is generated in the second semiconductor device and extracted therefrom, while the coherent light beam is optically modulated by the signal changing the carrier density in the semiconductor device; and having an optical output for transferring the modulated optical signal.

17. The transmitter as defined in claim 16, wherein the laser resonator comprises an InP semiconductor gain structure having a mirrored first end region and a second end region disposed adjacent to the optical input of the second semiconductor device.

18. The transmitter as defined in claim 17, wherein the laser resonator comprises a first electrode disposed over the InP semiconductor gain structure.

19. The transmitter as defined in claim 14, wherein the second semiconductor device comprises a second electrode disposed over the InP semiconductor waveguide structure.

20. A method of operating an optical modulator including a semiconductor device having an optical input for receiving a continuous wave coherent light beam having a predetermined power, a waveguide layer for transferring the light beam, an electrode connected to a radio frequency signal input and a bias potential for creating an electric field in the waveguide and optically modulating the light beam as the beam traverses the waveguide, and an optical output connected to the waveguide for transferring the modulated optical signal, comprising:
applying a continuous wave coherent light beam to the optical input; and
applying a positive bias voltage to the electrode so that the coherent light beam is optically modulated by the signal modulating the absorption characteristic in the semiconductor device by operating in the negative current region of the I-V characteristic so that the current generated in the semiconductor device as a result of photoabsorption of the continuous wave coherent light beam is extracted from the semiconductor device by the bias field.

21. The optical modulator as defined by claim 1 wherein the positive bias potential is greater than about 0.4 volts and operation is in the negative current region in a range of 0 mA to −50 mA.

22. The electro-optical arrangement as defined by claim 11 wherein the positive bias potential is greater than about 0.4 volts and operation is in the negative current region in a range of 0 mA to −50 mA.

23. The laser transmitter as defined by claim 16 wherein the positive bias potential is greater than about 0.4 volts and operation is in the negative current region in a range of 0 mA to −50 mA.

24. The method of claim 20 wherein the positive bias potential is greater than about 0.4 volts and operation is in the negative current region in a range of 0 mA to −50 mA.

* * * * *